US006193568B1

(12) United States Patent
Dörr

(10) Patent No.: US 6,193,568 B1
(45) Date of Patent: Feb. 27, 2001

(54) MID CONNECTOR WITH EXTENDING SOLDER CREEPING PATHS

(75) Inventor: Martin Dörr, Heilbronn (DE)

(73) Assignee: Amphenol-Tuchel Electronics GmbH (DE)

( * ) Notice: Subject to any disclaimer, the term of this patent is extended or adjusted under 35 U.S.C. 154(b) by 0 days.

(21) Appl. No.: 09/316,049

(22) Filed: May 21, 1999

(30) Foreign Application Priority Data

May 22, 1998 (DE) .............................. 198 22 990

(51) Int. Cl.⁷ ..................................... H01R 4/02

(52) U.S. Cl. .............................. 439/876; 439/72; 439/83; 439/931

(58) Field of Search ................................ 439/931, 876, 439/83, 72, 74, 73, 395

(56) References Cited

U.S. PATENT DOCUMENTS

| 3,654,583 | * | 4/1972 | Mancini ................................. 339/17 |
| 4,902,235 | * | 2/1990 | Tonooka ................................. 439/72 |
| 4,973,262 | * | 11/1990 | Gerke et al. ......................... 439/359 |
| 5,030,113 | * | 7/1991 | Wilson ................................... 439/80 |
| 5,108,295 | * | 4/1992 | Koike et al. ........................... 439/79 |
| 5,653,601 | * | 8/1997 | Martucci et al. ...................... 439/82 |

* cited by examiner

Primary Examiner—Paula Bradley
Assistant Examiner—Truc Nguyen
(74) Attorney, Agent, or Firm—Blank Rome Comisky & McCauley, LLP

(57) ABSTRACT

A connector comprising: at least one contact, said contact being formed by a first and a second part, said first part being made of material adapted to be metallized, such that said contact forms soldering surfaces for termination purposes, and wherein between surfaces of the first part, which can be metallized, insulating material is provided by means of said second part so as to achieve an extension of the creeping paths.

9 Claims, 3 Drawing Sheets

MID CONNECTOR WITH EXTENDING SOLDER CREEPING PATHS

FIELD OF THE INVENTION

The present invention relates to a connector and in particular to an MID connector.

DESCRIPTION OF THE RELATED ART

Generally, connectors of the MID (MID=molded interconnect device) type are known. Connectors of the MID type are manufactured typically in an injection molding process using two components. Also, male and female connectors are known.

SUMMARY OF THE INVENTION

The present invention relates to a connector, in particular an MID connector and more particularly to an MID connector of the female type.

It is an object of the present invention to provide such a connector, wherein contact elements and a housing of the connector are integrally formed, i.e. as a single piece. It is a further object to provide large surfaces preferably as soldering surfaces for contacting as well as for mounting the connector on a printed circuit board.

It is a further object of the present invention to provide large air and creeping distances. Further, the connector should be designed such that it can be readily mounted.

In accordance with another object of the invention, the connector is, for instance, in the form of a microphone connector and can be of very small size.

In accordance with the invention, the soldering surfaces are centrally located at the component forming the connector Preferably said soldering surfaces are not located in the upper and lower end areas of the connector. Due to said larger soldering surface a higher force would be required to tear off the connector, which is preferably a female type connector, from a circuit board on which it is preferably mounted. Indeed, the required air and creeping distances can be readily provided without having to use webs or walls for this purpose.

In accordance with the invention, the connector consists of at least two parts, a first or inner part and a second or outer part. Said inner part is preferably provided according to the MID technique such that it consists of a plastic material which can be metallized. Said first inner part is surrounded by said second outer part, preferably by injection molding said second part around said first part. In the case of a female connector, the female sleeve forms a single part or is integral with the connector Other objects and further features of the present invention will be apparent from the following detailed description with respect to preferred embodiments of the invention when read in conjunction with the accompanying drawings.

BRIEF DESCRIPTION OF THE DRAWINGS

The connector 10 as shown in the drawings is designed preferably as a female connector. The connector 10 comprises a first inner part 11 made of plastic material which can be metallized. The inner part 11 is preferably manufactured by injection molding. As can be seen in FIG. 2 said inner part 11 is surrounded by a second or outer part 12. FIG. 4 discloses the outer part 12 separately and it can be injection molded around said inner part 11. The outer part 12 is made of a plastic material which cannot be metallized.

FIG. 5 discloses that the connector 10 comprises metallized portions or surfaces which are formed by the inner part. These metallized portions or surfaces are formed by the inner part 11, preferably by those portions which are not covered by the outer part 12. Preferably, the metallization of the surfaces which need to be metallized occurs after the outer part has been injection molded around the inner part 11. It is also possible to metallize the inner part 11 after its being produced and then injection mold the second or outer part 12 around the inner part 11. In any event, FIG. 5 shows the metallized surface by means of dots. The upper surfaces of the outer part 12 are creeping path extensions as will be described below in detail. Further, in FIG. 5 the cross-hatched surfaces are also surfaces of the inner part 11 which are not metallized. The hatched surfaces are surfaces of the outer part 12.

Preferably, the connector 10 is used together with a printed circuit board. If the connector 10 is used together with a printed circuit board, it would be located on respective contact areas of the printed circuit board by means of metallized block-like surfaces, for instance surfaces 21, 24, 27, as will be described in more detail below.

Following this general overview, the connector 10 of the invention will now be described in more detail referring to FIGS. 1 to 4.

Figure 2:
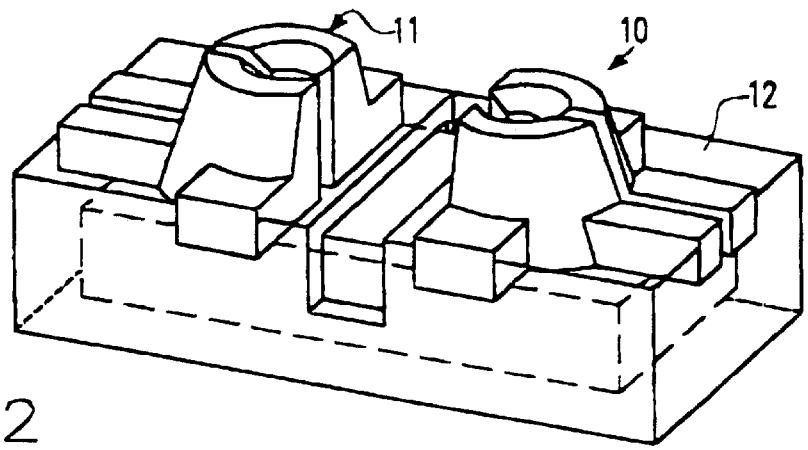
FIG. 2 is a schematic representation of the female connector of FIG. 1 showing the design thereof.
Figure 3:
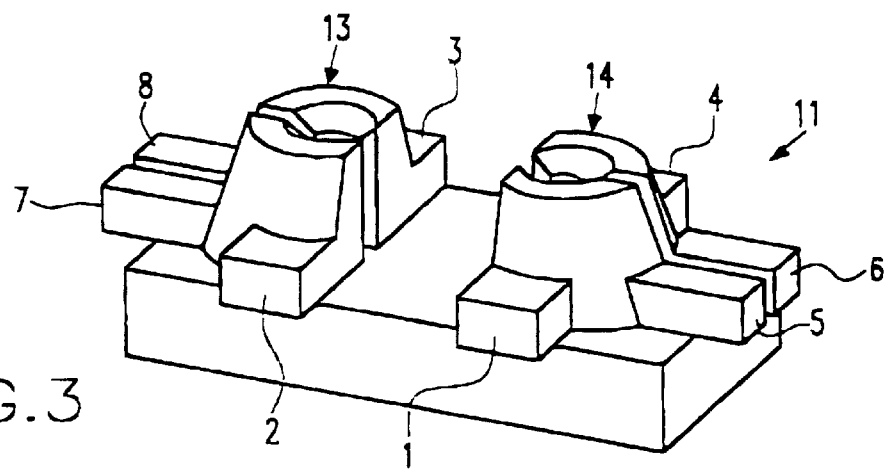
FIG. 3 discloses the inner part of the connector of FIG. 1 which is made of a plastic material which can be metallized.
Figure 4:
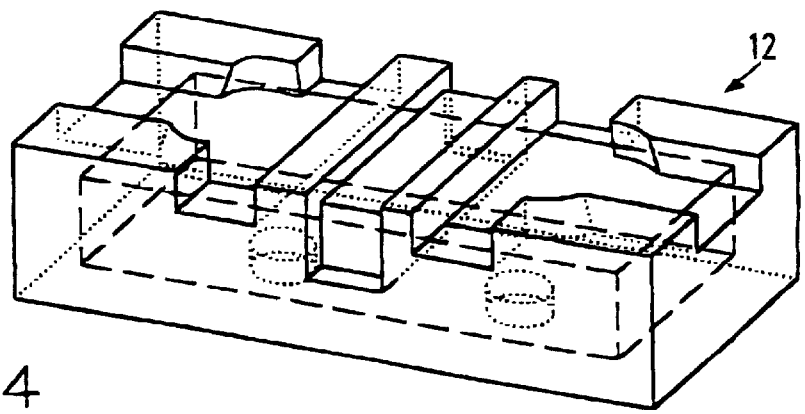
FIG. 4 shows the outer part of the female connector of FIGS. 1 and 2 with the material of the outer part being of a type which cannot be metallized but can be injection molder around the inner part.
Figure 5:
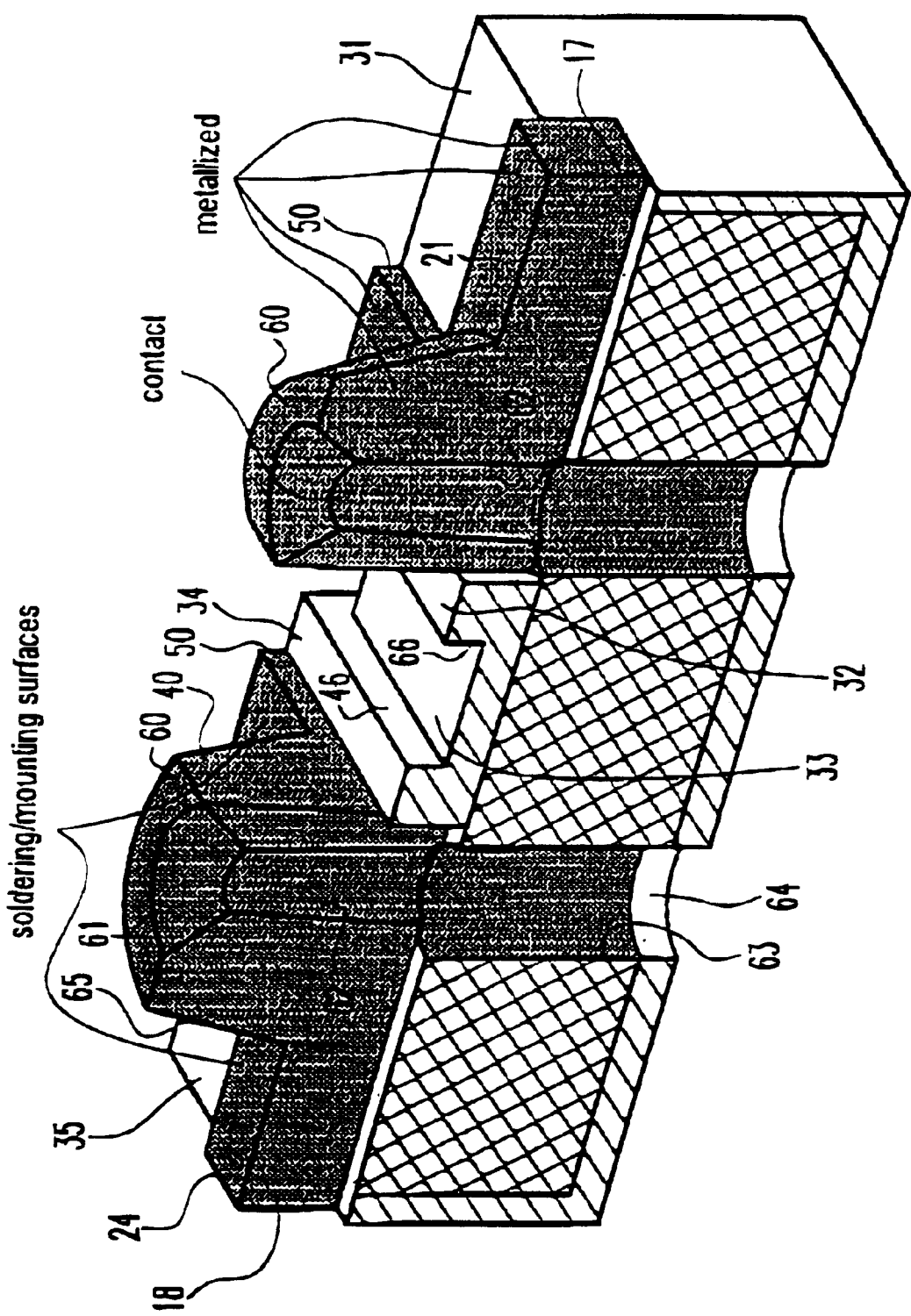
FIG. 5 is a longitudinal sectional view along line S—S of the center of the connector of FIG. 1.

The inner part 11 is, see for instance FIGS. 2, 3 and 5, substantially in the form of a rectangular parallel-epiped with block-like rod parts 1 to 8 (see FIG. 3).

Doughnut-shaped projections 13 and 14, respectively, are spaced and extend upwardly. As can be seen for instance in FIG. 1, the inner part 11 is surrounded by the injection molded outer part 12, such that the surface of the inner part is, in substance, somewhat lower than the outer surfaces of the rod portions 1 through 8 mentioned above Thus, larger air and creep distances are achieved.

Figure 1:
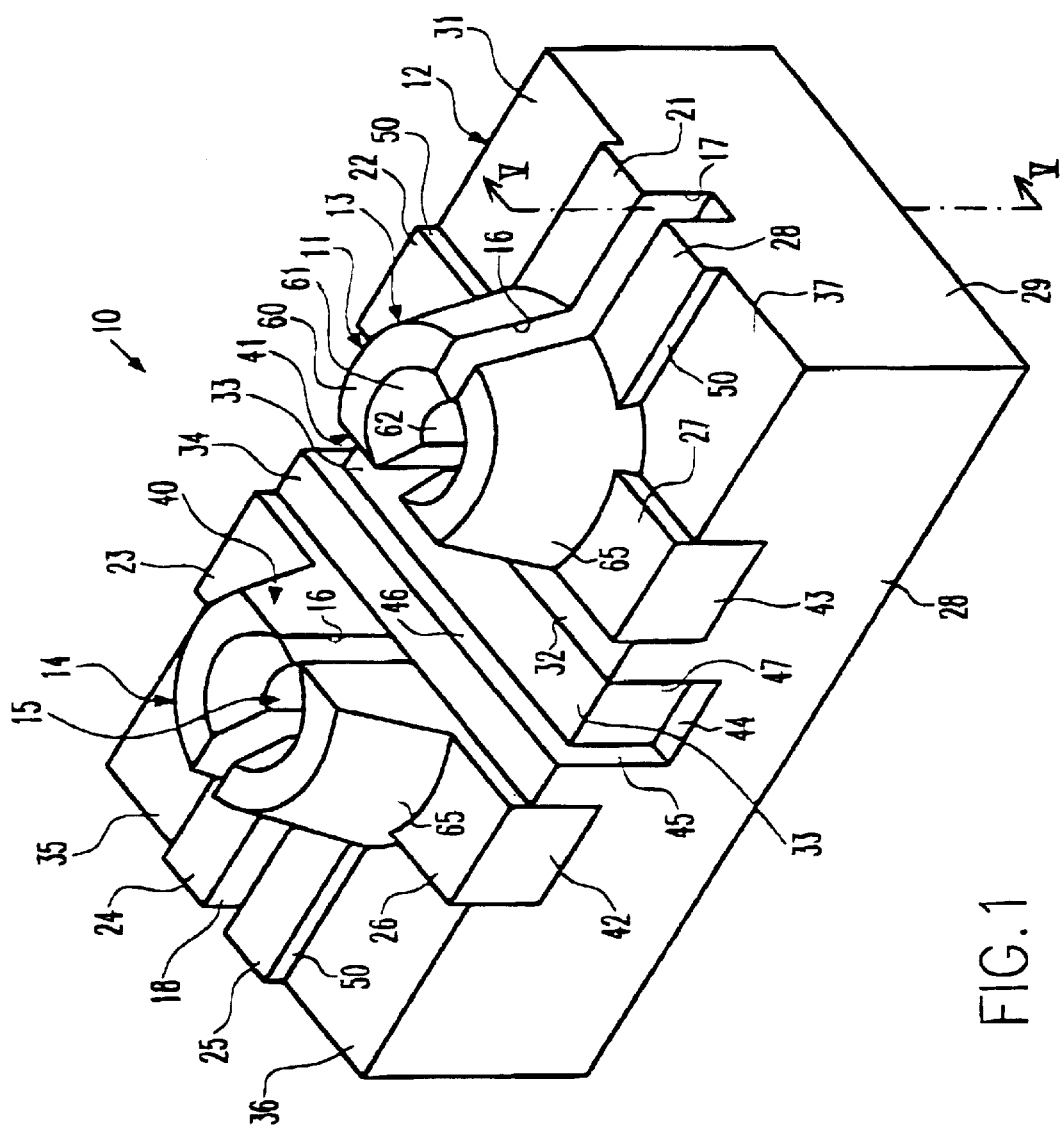
FIG. 1 is an isometric view of a female connector according to the invention.

Each of said projections 13 and 14 form respective insert openings or funnel means 15 adapted to receive a contact pin, for instance the contact pin of a counter connector, i.e. of a male connector. The projections 13 and 14 are centrally located and they are slotted in longitudinal direction of the connector 10, i.e. the projections are split by a slot 16 (FIG. 1). Said slot 16 in each of said projections 13, 14 has a continuation in the form of slots 17 and 18 in the inner part 11. As shown in FIG. 5, between said two projections 13, 14 there is located material (which is not metallized) of the outer part 12 and thus forms creeping path extensions.

As already mentioned, the inner part 11 forms soldering surfaces 21 through 28. Said soldering surfaces 21 to 28 are, as is also shown in FIG. 5, metallized. The soldering surfaces 21 to 28 are in electrical connection with a metallized cylinder surface 62 forming a contact or contact element. This is achieved for each projection 13 and 14, respectively, by downwardly flaring conical outer surfaces 65, the planar surfaces 60 and the conical downwardly flaring surfaces 61. The outer part 12 forms between the soldering surfaces 21 through 28 non-metallized surfaces 31 through 37. Said non-metallized surfaces 31 through 37 are preferably on a lower level than the soldering surfaces 21 through 28 due to step surfaces 50.

Preferably, the doughnut-shaped projections 13 and 14 are cut off at their transversely adjacently located surfaces such that cut surfaces 41 and 42, respectively, are formed which extend transversely with respect to the direction of the longitudinal axis of the connector 10.

As mentioned, material of the outer part which forms surfaces 34, 46, 33, 66 and 32 is located between said generally metallized surfaces 40 and 41 so as to provide an extension of the creeping path. Also between the generally metallized side surfaces 42, 43 of the rod elements 1 and 2 creeping path extensions are formed by the step surfaces 45, 44 and 47.

What is claimed is:

1. A connector, comprising:

at least one contact, said at least one contact including a first part and a second part, wherein said first part is made of a material adapted to be metallized, metallized portions of said first part forming soldering surfaces, wherein the first part includes a cylinder surface that projects from an upper surface of the first part and is metallized to form a contact of said connector, and wherein said second part is made of a non-metallizable insulating material having surfaces that extend between said soldering surfaces so as to provide extended creeping paths for solder applied to said soldering surfaces.

2. A connector as claimed in claim 1, wherein said soldering surfaces are arranged to serve as mounting surfaces for mounting said connector on a printed circuit board.

3. A connector as claimed in claim 1, wherein said second part is injection molded around said first part.

4. A connector as claimed in claim 1, wherein said first part is made of a plastic material that can be metallized.

5. A connector as claimed in claim 1, wherein additional surfaces of said first part are metallized to form contact surfaces for receiving contacts of a mating connector.

6. A connector as claimed in claim 1, wherein said metallized soldering surfaces include rod-like portions.

7. A connector, comprising:

at least one contact, said at least one contact including a first part and a second part, wherein said first part is made of a material adapted to be metallized, metallized portions of said first part forming soldering surfaces, wherein said second part is made of a non-metallizable insulating material having surfaces that extend between said soldering surfaces so as to provide extended creeping paths for solder applied to said soldering surfaces;

wherein said first part includes substantially cylindrical projections that project from an upper surface of the first part and are metallized to form contacts of said connector; and wherein said soldering surfaces include portions extending away from said cylindrical projections, said extending portions being raised above adjacent surfaces of said second part to expand said creeping paths.

8. A connector as claimed in claim 1, wherein said cylinder surface is slotted to a form molded interconnect device (MID) contact.

9. A connector, comprising:

at least one contact, said at least one contact including a first part and a second part, wherein said first part is made of a material adapted to be metallized, metallized portions of said first part forming soldering surfaces, wherein said second part is made of a non-metallizable insulating material having surfaces that extend between said soldering surfaces so as to provide extended creeping paths for solder applied to said soldering surfaces;

wherein said first part includes substantially cylindrical projections that project from an upper surface of the first part and are metallized to form contacts of said connector; and wherein said projections are conical and include cut-off portions on facing sides of said projections, said cut-off portions cutting off approximately one fourth of a cross section of each projection.

* * * * *